United States Patent
Suzuki

[11] Patent Number: 6,103,560
[45] Date of Patent: Aug. 15, 2000

[54] PROCESS FOR MANUFACTURING A SEMICONDUCTOR DEVICE

[75] Inventor: Hisamitsu Suzuki, Tokyo, Japan

[73] Assignee: NEC Corporation, Tokyo, Japan

[21] Appl. No.: 08/996,795

[22] Filed: Dec. 23, 1997

[30] Foreign Application Priority Data

Dec. 25, 1996 [JP] Japan ................................. 8-345470

[51] Int. Cl.[7] .............................................. H01L 21/8238
[52] U.S. Cl. ........................................ 438/202; 438/234
[58] Field of Search .................................. 438/202, 234, 438/203, 204, 532

[56] References Cited

U.S. PATENT DOCUMENTS

| | | |
|---|---|---|
| 5,026,654 | 6/1991 | Tanba et al. ............................. 438/202 |
| 5,089,429 | 2/1992 | Hsu . | |
| 5,234,847 | 8/1993 | Iranmanesh ............................. 438/202 |

FOREIGN PATENT DOCUMENTS

| | | |
|---|---|---|
| 0-244-171-A1 | 4/1986 | European Pat. Off. . |
| 0-694-963-A2 | 1/1996 | European Pat. Off. . |
| 3-69157 | 3/1991 | Japan . |
| 3-235362 | 10/1991 | Japan . |
| 4-74434 | 3/1992 | Japan . |
| 8-55924 | 2/1996 | Japan . |

*Primary Examiner*—Tuan H. Nguyen
*Attorney, Agent, or Firm*—Hutchins, Wheeler & Dittmar

[57] ABSTRACT

Implantation of a high concentration of P type impurity in an emitter electrode can be prevented during forming a source-drain of PMOS and a extrinsic base, by keeping an insulating film intact only on an emitter electrode and simultaneously patterning the insulating electrode and a gate electrode, leading to prevention of increase and dispersion of an emitter resistance.

23 Claims, 10 Drawing Sheets

PROCESS FOR MANUFACTURING A SEMICONDUCTOR DEVICE

BACKGROUND OF THE INVENTION

1. Field of the Invention

This invention relates to a process for manufacturing a semiconductor integrated circuit device comprising a bipolar transistor formed on a semiconductor substrate and a complementary field-effect transistor (hereinafter, referred to as CMOS).

2. Description of the Related Art

BiCMOS technology is one for forming a bipolar transistor having characteristics of high-speed actuation and high driving performance and a CMOS having a characteristic of low power consumption, on the same substrate, which is one of the most effective procedures for meeting recent demands on lower power consumption and higher speed in a semiconductor device.

Since BiCMOS technology requires many steps, cost reduction has been strongly desired. JP-A 4-74434 and JP-A 8-55924 have disclosed techniques for meeting such demands.

As the first prior art, description of JP-A 4-74434 will be briefly illustrated by referring to FIGS. 5(a) to (c) and FIGS. 6(a) to (c).

As seen in FIG. 5(a), on a P type silicon substrate 301 are formed an $N^+$ buried layer 303 and a $P^+$ buried layer 302; is grown an N type epitaxial layer 304; and then are formed an N well 305 and a P well 306.

Then, on the substrate are formed a field oxide film 307 by LOCOS technique and then a gate oxide film 308, and boron ion is implanted with a mask 901 to form a P type base area 309.

Then, as seen in FIG. 5(b), an emitter contact 310 and a collector contact 311 are opened with a mask 902.

As seen in FIG. 5(c), a polysilicon 312 is deposited over the whole surface, and then arsenic ion is implanted on a given area.

Then, as seen FIG. 6(a), phosphorous ion is implanted in a given area with a mask 903.

Then, as seen FIG. 6(b), the polysilicon 312 is selectively etched to form an emitter polysilicon 314, a collector polysilicon 315 and a gate polysilicon 313.

Herein, the arsenic ion is implanted for forming an emitter diffusion layer 317 which will be described later, while the phosphorous ion is implanted for forming a collector diffusion layer 318 and an $N^+$ type gate polysilicon 313 both of which will be described later.

Then, as seen in FIG. 6(c), an N type LDD layer 320 and a P type LDD layer 321 are formed; an oxide film is deposited over the whole area of the wafer, and it was etched back by RIE technique to form a side wall 319 consisting of an oxide film.

Then, an $N^+$ type source-drain 322 is formed, and a $P^+$ type source-drain 323 and a extrinsic base 316 are simultaneously formed.

Then, the substrate is treated by heat to form an emitter diffusion layer 317 and a collector diffusion layer 318, to give a device portion of a BiCMOS integrated circuit.

Next, as the second prior art, the technique described in JP-A 8-55924 will be briefly described by referring to FIGS. 7(a) to (c) and FIGS. 8(a) to (c).

As seen in FIG. 7(a), on a P type silicon substrate 401 are formed an $N^+$ buried layer 403, a $P^+$ buried layer 402, an N well 406 and a P well 405, and then boron ion is implanted through a first oxide film 404 about 30 nm thick, using a mask 911. The conditions of ion-implantation may be, for example, $7.0\times10^{13}$ $cm^{-2}$ at 10 keV. Thus, a P type base area 409 is formed.

As seen in FIG. 7(b), after removing the first oxide film 404, a gate oxide film 408 10 nm thick is formed by thermal oxidation. Then, a part of the gate oxide film 408 for an emitter contact 410 is removed with a mask 912 by, for example, selectively etching with 10% HF for 10 seconds.

Then, as seen in FIG. 7(c), a polysilicon 412 about 350 nm thick is deposited over the whole area of the wafer by LPCVD technique, and then boron ion is implanted in an area where a gate of PMOS will be formed, with a mask 913, for example, under the conditions of $2\times10^{15}$ $cm^{-2}$ at 20 keV.

Then, as seen in FIG. 8(a), arsenic ion or phosphorous ion is implanted on the areas where an emitter and a gate of NMOS will be formed; for example, under the conditions of $1\times10^{16}$ $cm^{-2}$ at 100 keV for arsine.

Then, as seen FIG. 8(b), the polysilicon 412 is selectively etched to form an emitter polysilicon electrode 414 and a gate polysilicon electrode 413.

Then, as seen in FIG. 8(c), an N type LDD layer 420 and a P type LDD layer 421 are formed, and a dielectric film is deposited over the whole area of the wafer, and etched back to form a side wall 419 which consists of an oxide film, preferably of an oxide film and a nitride film on the oxide film.

Then, an $N^+$ type source-drain 422 is formed, and a $P^+$ type source-drain 423 and a extrinsic base 416 are simultaneously formed, and the substrate is treated by heat.

Herein, the gate of the PMOS is doped by an ion-implantation of a $P^+$ type source-drain 423, and the gate of the NMOS is doped by an ion-implantation of a $N^+$ type source-drain 422.

After above process, silicification may be conducted on the surfaces of the gate polysilicon electrode 413, the $P^+$ type source-drain 423, $N^+$ type source-drain 422 and/or the emitter polysilicon electrode 414 by a known technique.

SUMMARY OF THE INVENTION

Problems in the prior art in which a gate polysilicon and an emitter polysilicon share a wiring, will be descried by referring to FIG. 9, wherein 501 is a P type silicon substrate, 502 is an $N^+$ type buried layer, 503 is an N type epitaxial layer, 504 is a collector diffusion layer, 505 is a field oxide film, 506 is an emitter polysilicon, 507 is a P type base area, 508 is a extrinsic base, 509 is a side wall and 916 is a mask.

In the prior art in which a gate polysilicon and an emitter polysilicon share a wiring layer, the $N^+$ type emitter polysilicon is separated from the $P^+$ type extrinsic base by a distance indicated by WEB in FIG. 9(a). It provides a margin larger than an alignment deviation in an exposure step in a process for forming the extrinsic base. However, as scaling, i.e., size reduction and refinement, proceeds in a bipolar transistor, WEB becomes smaller as shown in FIG. 9(b). Thus, when a deviation in alignment occurs in an exposure step in a process for forming the $P^+$ type extrinsic base, a mask 916 over the emitter polysilicon may be opened, for example, as shown in FIG. 9(c), in which a high concentration of P type impurity may be implanted.

Such an event may cause deterioration in quality of a bipolar transistor such as;

(1) increase of the emitter resistance of the bipolar transistor and increase of dispersion of the emitter resistance value, and (2) reduction in a current gain of the bipolar transistor and increase in dispersion of the current gain.

Thus, this invention is to provide a process for manufacturing a semiconductor device wherein the above deterioration in quality of a bipolar transistor can be prevented by avoiding implantation of a high concentration of P type impurity in an emitter polysilicon in a process for forming a extrinsic base of a bipolar transistor even when scaling proceeds in the bipolar transistor in which a wiring layer is shared by a gate polysilicon electrode and an emitter polysilicon electrode.

To solve the above problems, this invention provides a process for manufacturing a semiconductor device, comprising forming a gate oxide film and opening an emitter contact on the surface of a semiconductor substrate; forming a conducting film and an insulating film on the gate oxide film; selectively keeping the insulating film intact on an area including the area for the emitter contact; forming a mask for a gate electrode; and simultaneously forming a gate electrode and an emitter electrode.

Furthermore, this invention provide a process for manufacturing a semiconductor device, comprising forming a gate oxide film and opening an emitter contact on the surface of a semiconductor substrate; forming a conducting film and an insulating film on the gate oxide film; selectively keeping the insulating film intact on an area including the area for the emitter contact; forming a mask for a gate electrode and an emitter electrode; and simultaneously forming a gate electrode and an emitter electrode.

According to the process for manufacturing a semiconductor device of this invention, an insulating film is preformed on an area for forming an emitter polysilicon, and then, in a process for forming a gate polysilicon and an emitter polysilicon the emitter polysilicon and the gate polysilicon are etched, employing, as a mask during etching, an insulating film or a combination of an insulating film and a photoresist for the former, and a photoresist for the latter. Thus, the insulating film can be kept intact at least on the area in which ion may be implanted during a process for forming a extrinsic base, and the insulating film acts as a mask for ion-implantation during the process for forming a $P^+$ type extrinsic base to prevent implantation of a high concentration of P type impurity in an emitter polysilicon.

DETAILED DESCRIPTION OF THE PREFERRED EMBODIMENTS

Example 1

An embodiment of this invention will be described by referring to FIGS. 1(a) to (c) and FIGS. 2(a) to (c).

Figure 1A:
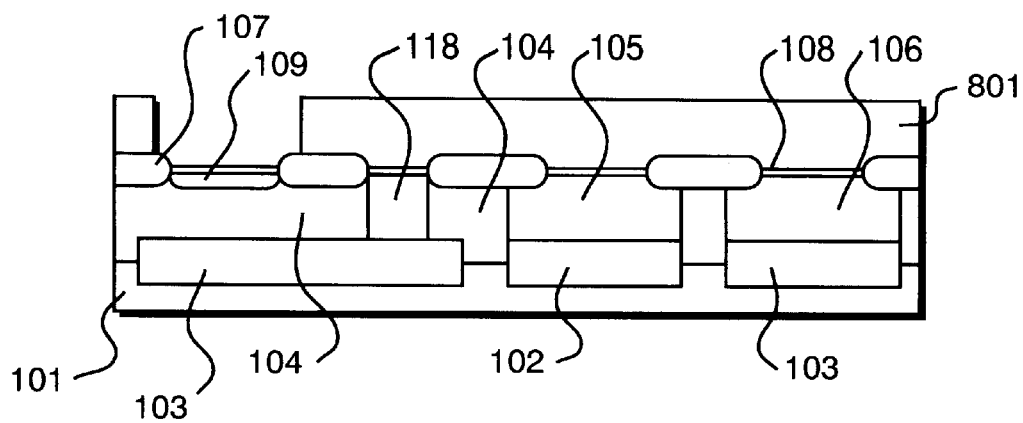
FIGS. 1A–1C shows a sectional process drawing to illustrate Example 1 according to this invention.

As shown in FIG. 1(a), in accordance with the prior art, on a P type silicon substrate 101 are formed a $N^+$ buried layer 103 and a $P^+$ buried layer 102; is grown a N type epitaxial layer 104; and are further formed a N well 106 and a P well 105. Then, a field oxide film 107 from 200 to 500 nm thick is formed by a known technique; a gate oxide film 108 from 3 to 10 nm thick is formed by thermal oxidation; and boron ion is implanted using a mask 801 of, for example, a photoresist, to form a P type base area 109.

Figure 1B:
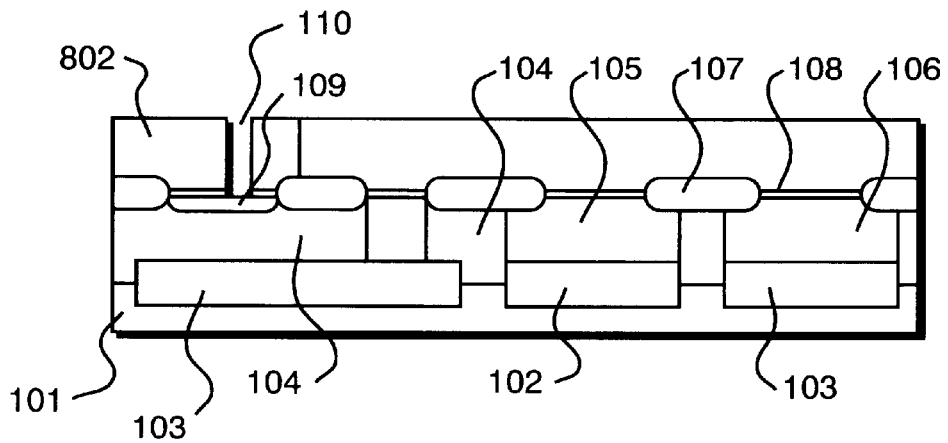

Then, as seen in FIG. 1(b), apart of the gate oxide film 108 on an emitter contact 110 is selectively removed using a mask 802 of, for example, photoresist by, for example, wet etching or dry etching.

Figure 1C:
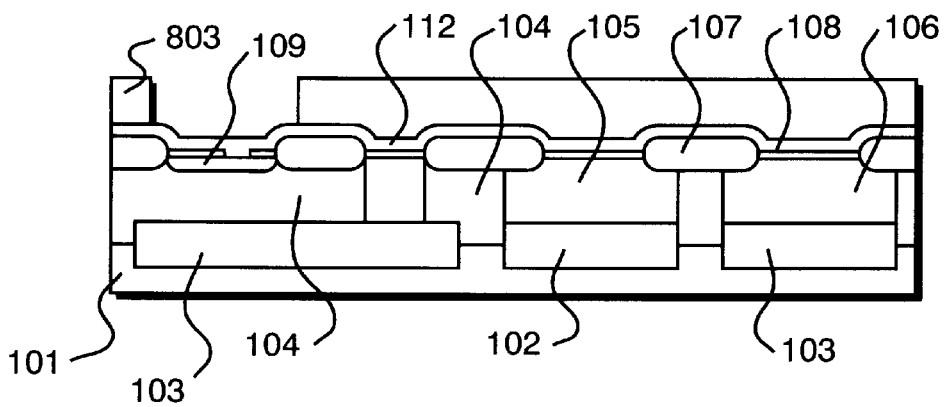

Then, as seen in FIG. 1(c), a polysilicon 112 from 100 to 500 nm thick is grown over the whole surface of the wafer, wherein the polysilicon is preferably non-doped or grown containing an N type impurity such as phosphorous and arsine in concentration of $1\times10^{17}$ to $1\times10^{21}$ cm$^{-3}$, preferably $1\times10^{18}$ to $1\times10^{20}$ cm$^{-3}$, by employing a known CVD technique.

After growing of the polysilicon, the area including a region for forming an emitter polysilicon is opened using a mask 803 of, for example, photoresist; for example, an $N^+$ type impurity such as phosphorous and arsenic ion is implanted at, e.g., 5 to 70 keV to achieve its total concentration of $1\times10^{19}$ to $1\times10^{21}$ cm$^{-3}$ in the polysilicon.

The above ion-implantation is not necessary when the polysilicon is grown containing the impurity in a high concentration in the above step of growing the polysilicon.

Figure 2A:
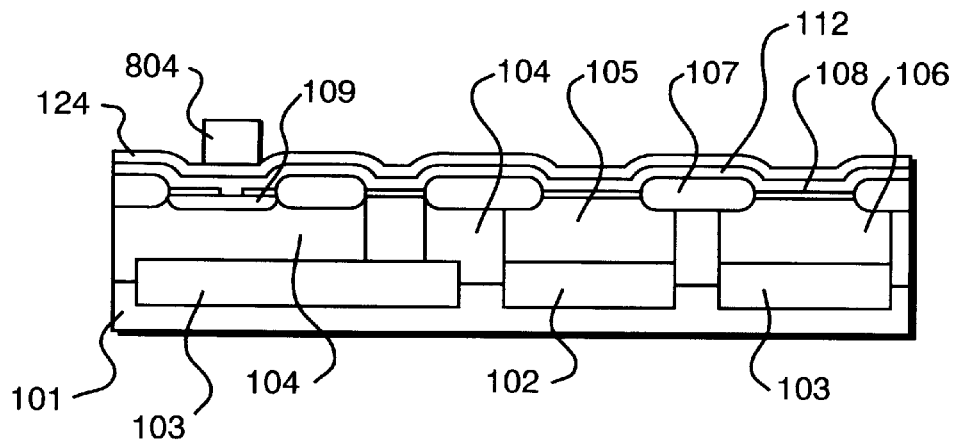
FIGS. 2A–2C shows another sectional process drawing illustrate Example 1 according to this invention.

Then, as seen in FIG. 2(a), a silicon oxide film from 100 to 300 nm thick and the first insulating film 124 such as a slicon nitride film are grown by, for a known process such as a CVD technique, and then a mask 804 of, for example, photoresist is formed on the area for forming an emitter polysilicon.

Figure 2B:
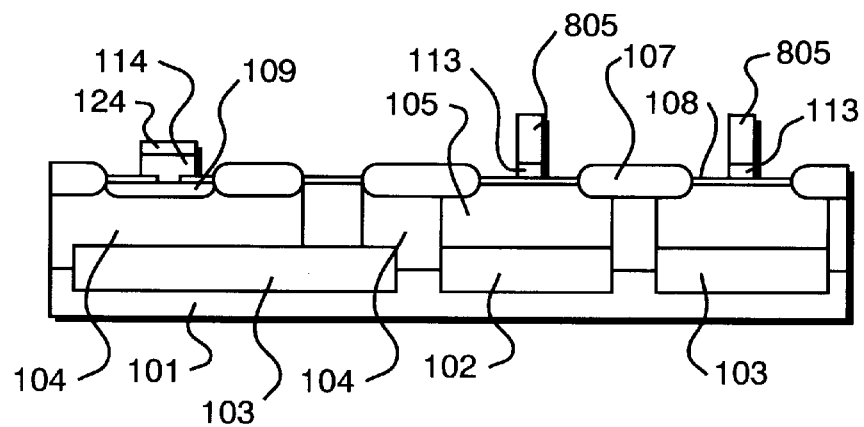

Then, as seen in FIG. 2(b), the first insulating film 124 is subject to patterning by a known anisotropic etching technique, the mask 804 is removed, a mask 805 of, for example, photoresist is formed for forming a gate polysilicon, and then the polysilicon is selectively etched by a known technique.

During the process, the first insulating film 124 on the emitter polysilicon and a mask 805 on the gate polysilicon play a role of a mask to the above etching.

Figure 2C:
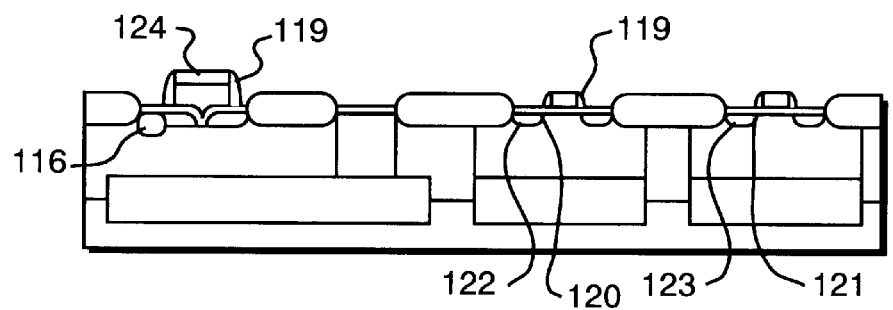

Then, as seen in FIG. 2(c), a N type LDD layer 120 and a P type LDD layer 121 are formed by a known technique; an insulating film such as a silicon oxide film and a silicon nitride film 30 to 200 nm thick is grown over the whole surface by a known process such as a CVD technique; it is etched back by a known anisotropic etching to form a side wall 119; a $N^+$ type source-drain 122 is formed; a $P^+$ type source-drain 123 and a extrinsic base 116 are simultaneously formed; and finally the substrate is treated by heat.

During formation of the extrinsic base 116, a high concentration of P type impurity is not implanted to the emitter polysilicon since the emitter polysilicon is completely covered with the first insulating film 124.

Furthermore, after completion of the above procedure, silicification may be conducted on the surfaces of the gate polysilicon 113, the P+ type source-drain 123, the N+ type source-drain 122 and/or the extrinsic base 116 by a known technique as is in the second prior art, which is not shown in the drawings. During the process, the emitter poilysilicon is not silicified since it is completely covered with the first insulating film 124.

Next, further scaling will be described by referring to FIGS. 10(a) and (b), wherein 601 is a field oxide film; 602 is a base diffusion layer; 603 is a collector diffusion layer; 604 is an emitter contact; 605 is an emitter polysilicon; 606 is an interlayer insulating film, 607 is a contact, 608 is a contact plug; and 609 is a metal line.

Figures 10A, 10B:
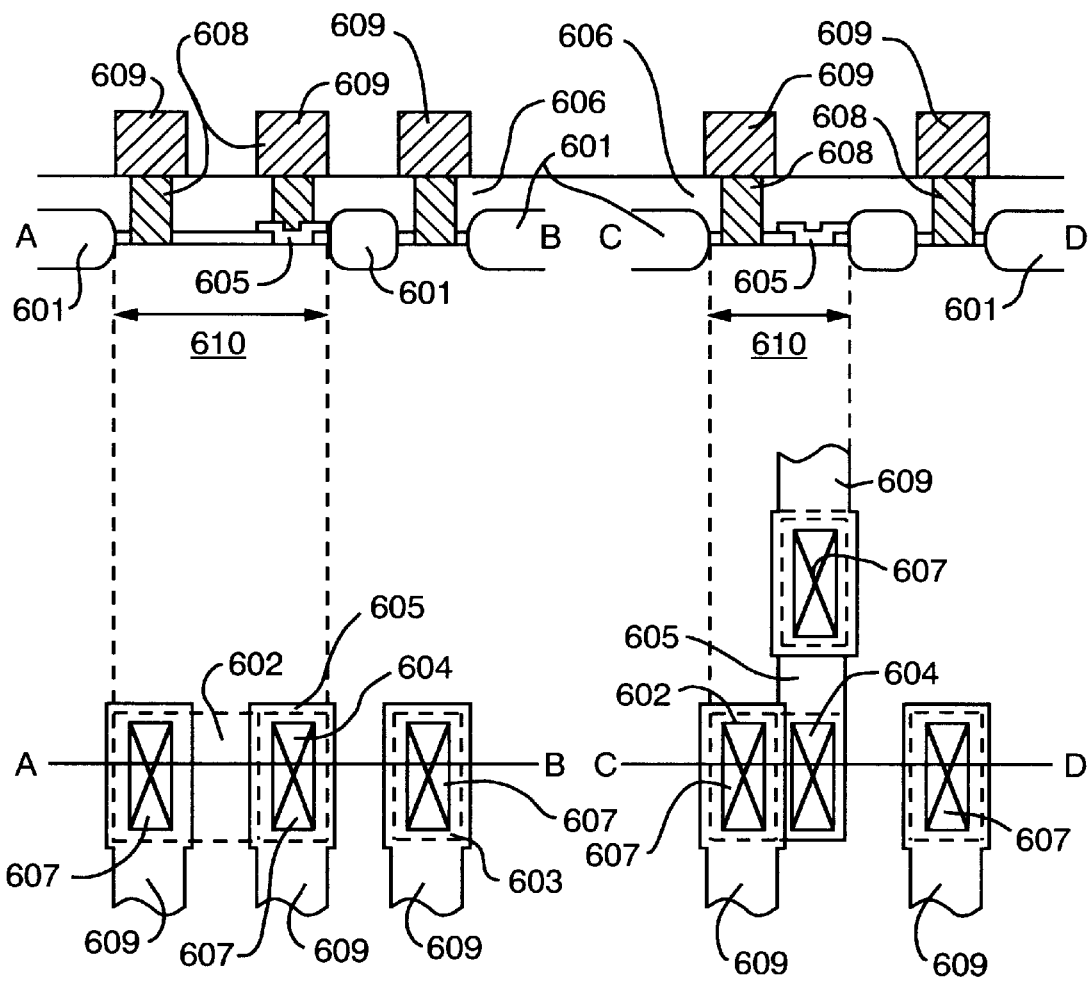
FIGS. 10A–10B shows top and sectional views to illustrate the problems in Example 1 according to this invention.

In the above Example 1, the first insulating film 124 completely covers over the emitter polysilicon 114 as shown in FIG. 2(c); the structure is as shown in the top and the sectional views of FIG. 10(a).

In general, the base diffusion layer width 610 in FIG. 10(a) should be subject to scaling for further improving performance and speed of the bipolar transistor.

For scaling of the base diffusion layer width 610 of the bipolar transistor, the linewidth and the line pitch of the metal line 609 should be reduced at the same time. However, since an electric current as high as several mA to several tens of mA is applied to emitter and collector electrodes in a bipolar transistor, reduction of the linewidth of the metal line 609 may cause deterioration of resistance to electromigration and of the quality of the metal line. Therefore, a method for scaling without reduction of the linewidth of the metal line 609, is desired.

In the top view of FIG. 10(b), scaling leads to a longer wire length for the emitter polysilicon 605 than one in FIG. 10(a).

Example 2

Thus, it may be undesirable due to its causing increase of emitter resistance. As a specific procedure for solving the problem, the second embodiment according to this invention will be described.

The second embodiment of the process for manufacturing a semiconductor device according to the invention will be described by referring to FIGS. 3(a) to (c) and FIG. 4.

Figure 3A:
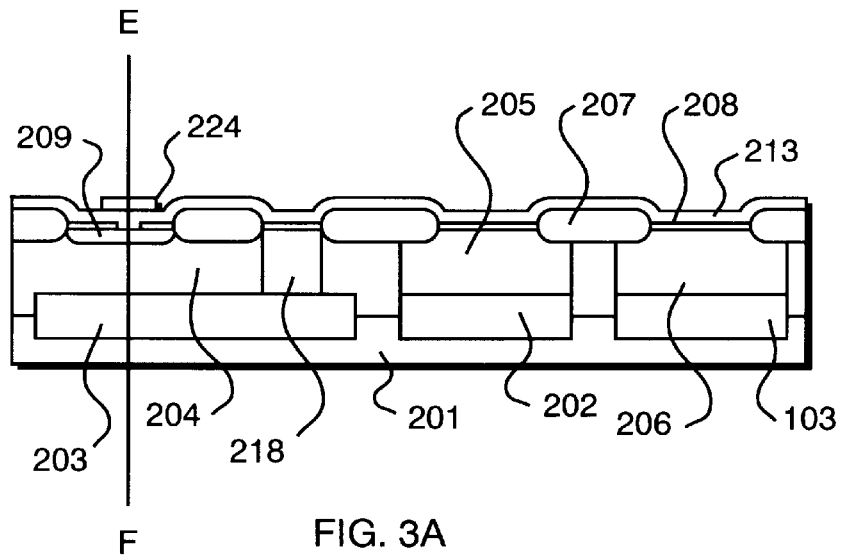
FIGS. 3A–3C shows a sectional process drawing to illustrate Example 2 according to this invention.
Figure 3B:
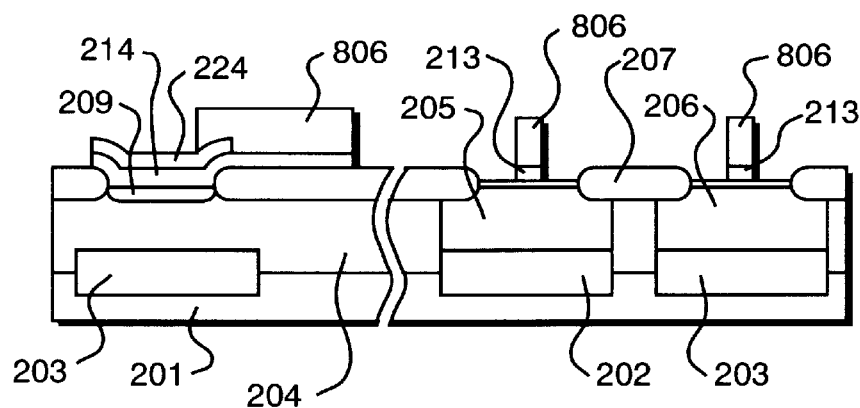
Figure 3C:
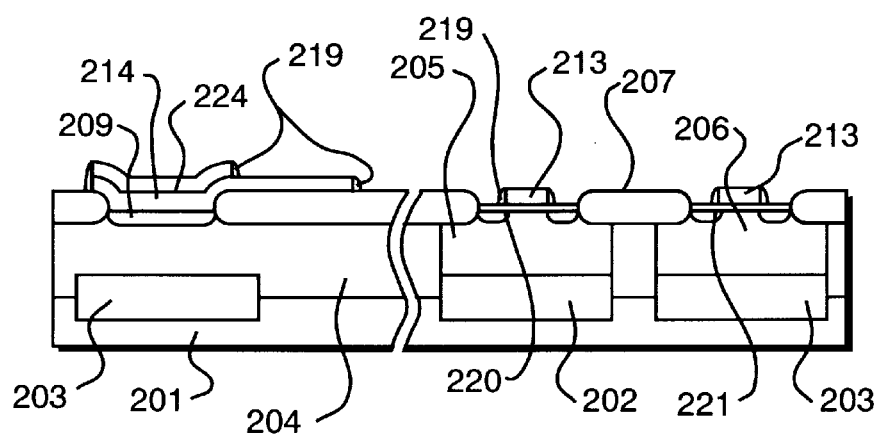
Figure 4:
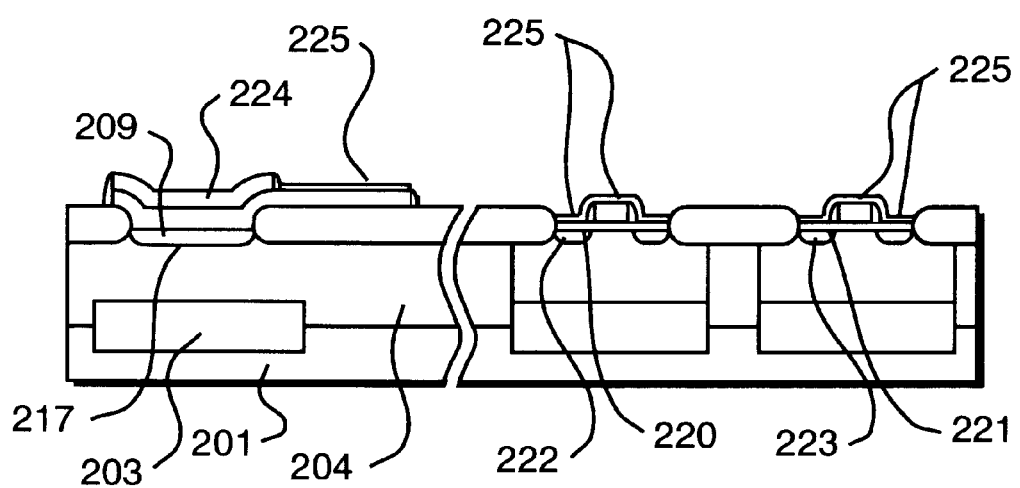
FIG. 4 shows another sectional process drawing to illustrate Example 2 according to this invention.
Figure 5A:
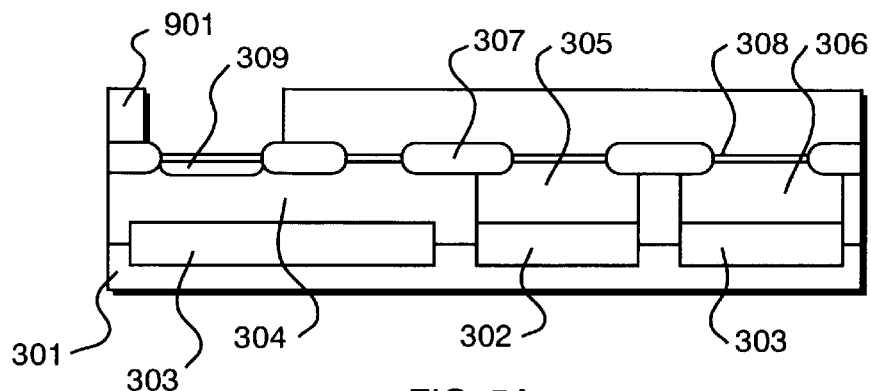
FIGS. 5A–5C shows a sectional process drawing to illustrate the first prior art.
Figure 5B:
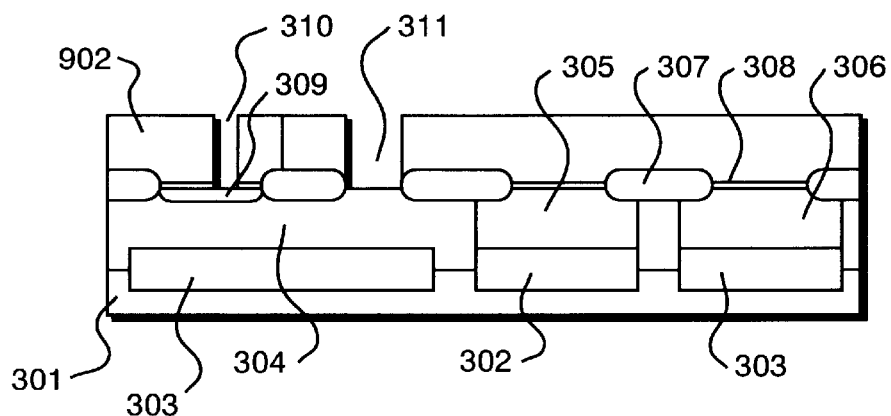
Figure 5C:
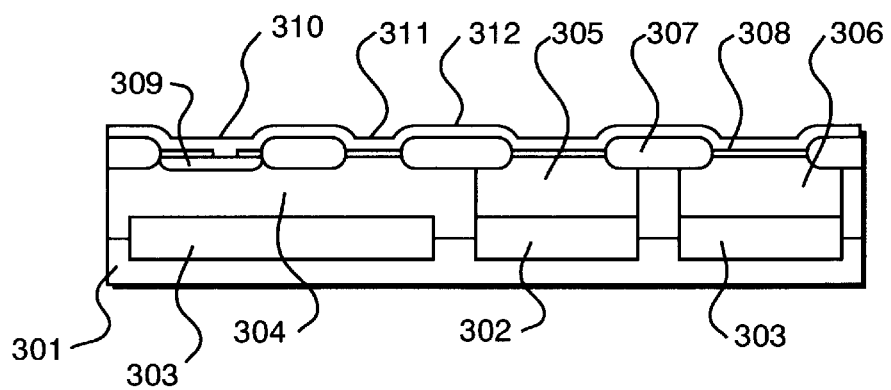
Figure 6A:
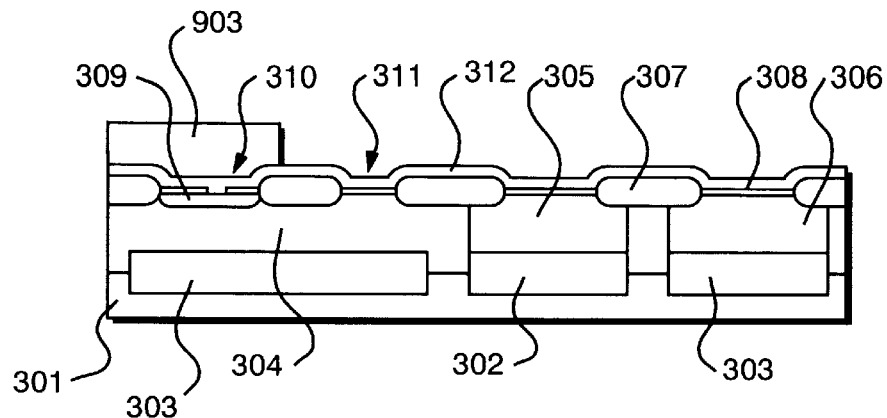
FIGS. 6A–6C shows another sectional process drawing to illustrate the first prior art.
Figure 6B:
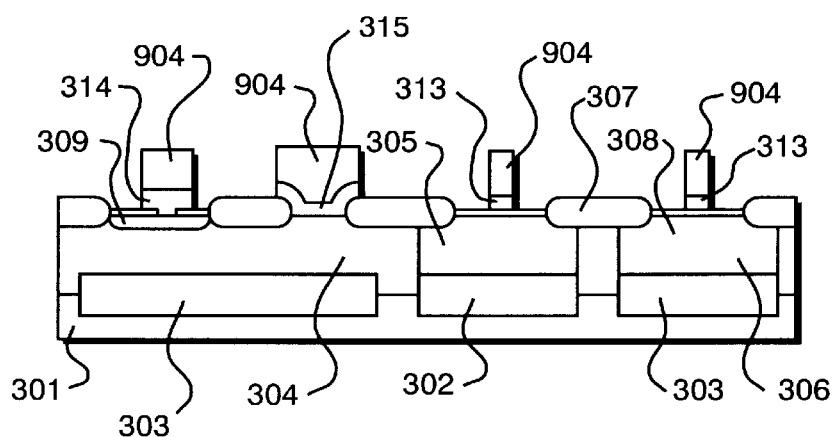
Figure 6C:
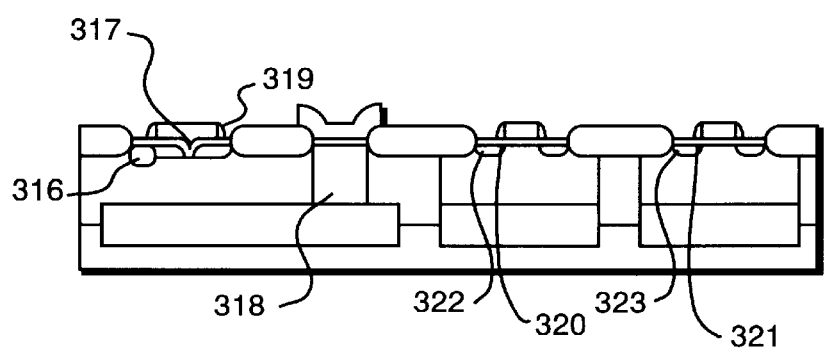
Figure 7A:
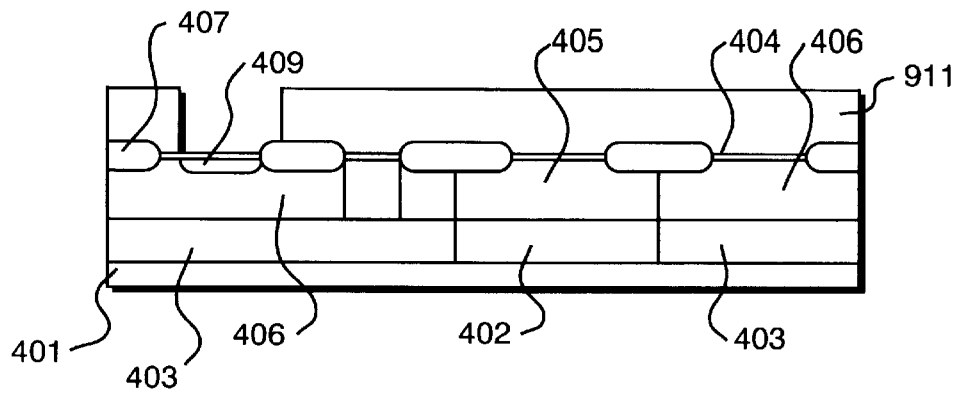
FIGS. 7A–7C shows a sectional process drawing to illustrate the second prior art.
Figure 7B:
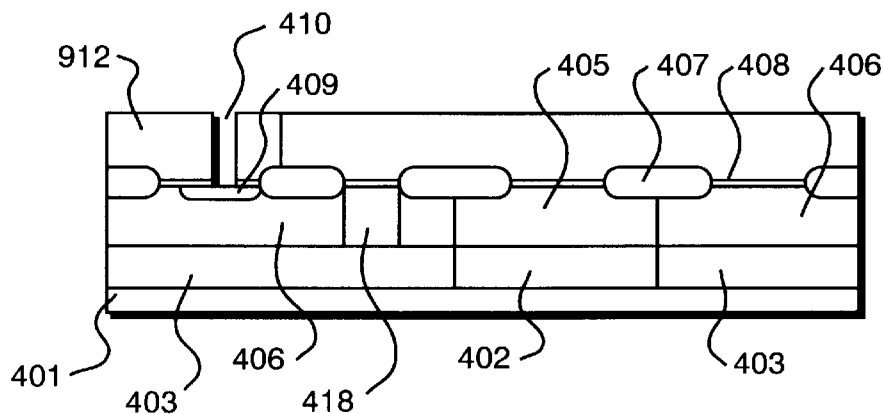
Figure 7C:
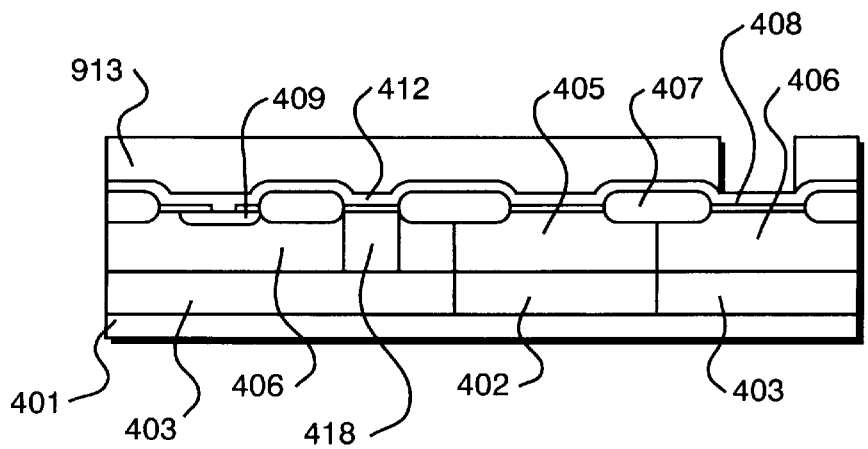
Figure 8A:
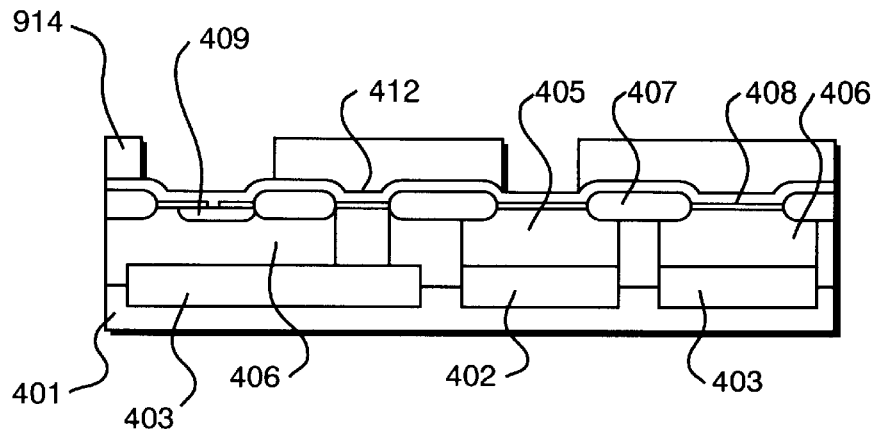
FIGS. 8A–8C shows another sectional process drawing to illustrate the second prior art.
Figure 8B:
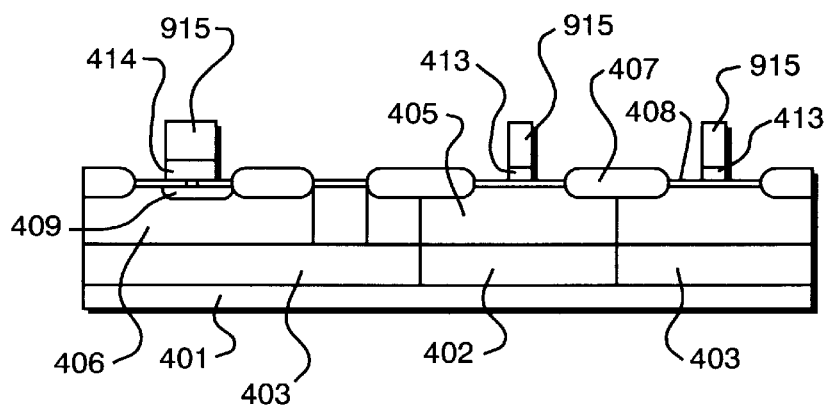
Figure 8C:
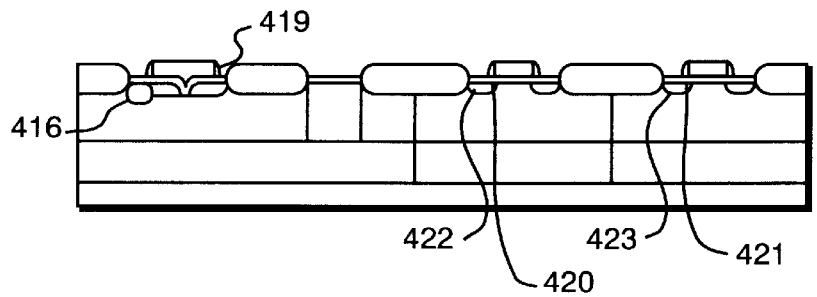
Figure 9A:
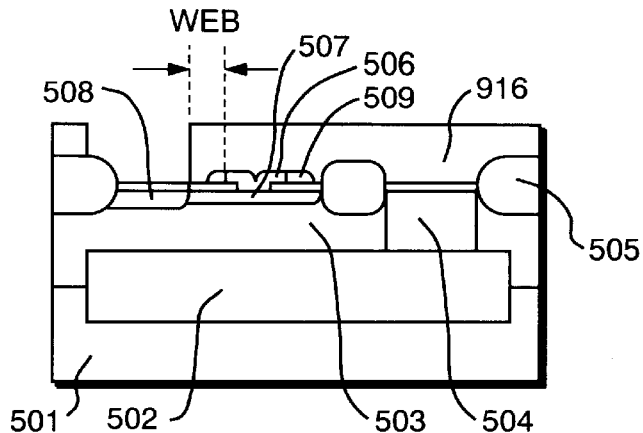
FIGS. 9A–9C shows sectional views to illustrate the problems of the prior art.
Figure 9B:
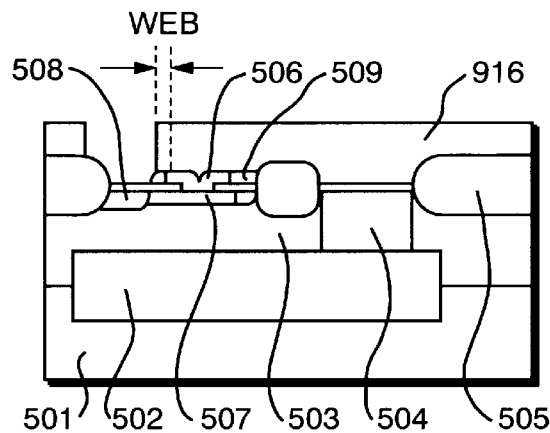
Figure 9C:
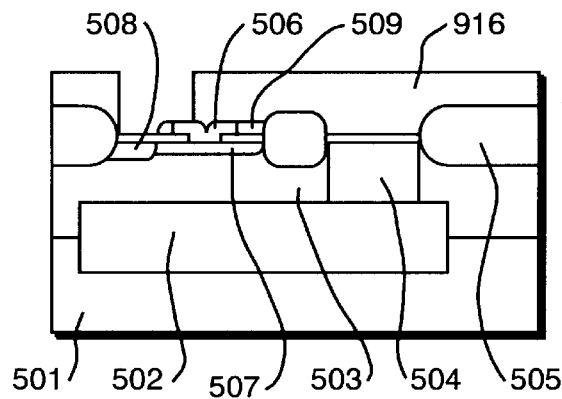

Herein, the sectional views of FIGS. 3(b), 3(c) and 4 for the bipolar transistor are those taken on line E–F of FIG. 3(a) for illustrating clearly.

In FIGS. 3 and 4, 201 is a P type silicon substrate; 202 is a P+ type buried layer; 203 is a N+ type buried layer; 204 is a N type epitaxial layer; 205 is a P well; 206 is a N well; 207 is a field oxide film; 208 is a gate oxide film; 209 is a P type base region; 213 is a polysilicon; 214 is an emitter polysilicon; 219 is a side wall; 220 is a N type LDD layer; 221 is a P type LDD layer; 222 is a N+ type source-drain; 223 is a P+ type source-drain; 224 is the second insulating film; 225 is a silicide layer; and 916 is a mask.

The sectional view for the semiconductor device according to Example 2 is as FIG. 10(b).

The cross-sectional structure shown in FIG. 1(c) is formed as described in Example 1. The following process will be described by referring to FIG. 3. As shown in FIG. 3(a), The second insulating film 224 from 100 to 300 nm thick is grown over the whole surface of the wafer by a known process such as a CVD technique. The second insulating film 224 may be a silicon oxide film and a silicon nitride film. The insulating film 224 is formed in a manner that the film covers at least the area on the emitter polysilicon which may be implanted with a high concentration of P type impurity due to an alignment deviation during an exposure step in forming a extrinsic base of a bipolar transistor.

Then, as seen in FIG. 3(b), a mask 806 of, for example, photoresist is formed for forming a gate electrode and a withdrawal part of the emitter polysilicon. An emitter polysilicon 214 and a gate polysilicon 213 are formed by a known anisotropic polysilicon etching, using, as a mask for etching, the insulating film 224 and the mask 806 for the former and the mask 806 for the latter.

Then, as seen in FIG. 3(c), a N type LDD layer 220 and a P type LDD layer 221 are formed by a known technique; an insulating film such as a silicon oxide film and a silicon nitride film 30 to 200 nm thick is grown over the whole surface by a known process such as a CVD technique; and it is etched back by a known anisotropic etching to form a side wall 219.

Then, as shown in FIG. 4, a N+ type source-drain 222 is formed; a P+ type source-drain 223 and a extrinsic base 216 are simultaneously formed; and the substrate is treated by heat.

Since the second insulating film 224 covers at least the area on the emitter polysilicon which may be implanted with a high concentration of P type impurity during formation of the P+ type source-drain 223 and the extrinsic base 216, the area is not implanted with a high concentration of P type impurity. During the process, the gate of PMOS is subject to doping, on which a final concentration of impurity depends.

The gate of NMOS is subject to doping during implantation of the N+ type source-drain 222, on which a final concentration of impurity depends.

Furthermore, silicification is conducted on the surfaces of the gate polysilicon 213, the P+ type source-drain 223, the N+ type source-drain 222, the extrinsic base 216 and/or the withdrawal part of the emitter polysilicon 214 by a known technique as is in the second prior art, to form a silicide layer 225.

Since a part of the emitter polysilicon 605 has been silicified to have a sheet resistance of several to several tens of $\Omega/\square$, the resistance of the withdrawal can be reduced, and thus the resistance of the emitter electrode, i.e., the emitter resistance, can be reduced.

As described above, according to the process of this invention for manufacturing a semiconductor device, deterioration in quality of a bipolar transistor can be prevented by avoiding implantation of a high concentration of P type impurity in an emitter polysilicon during a P+ type extrinsic base formation step, to prevent;

(1) increase of the emitter resistance of the bipolar transistor and increase of dispersion of the emitter resistance value, and (2) reduction in a current gain of the bipolar transistor and increase in dispersion of the current gain.

What is claimed is:

1. A process for manufacturing a semiconductor device, comprising:

forming a gate oxide film on a semiconductor substrate;

opening an emitter contact on the gate oxide film;

forming a conducting film and an insulating film on the gate oxide film;

selectively removing the insulating film except for an area substantially overlapping with the emitter contact;

forming a mask only for a gate electrode; and simultaneously forming the gate electrode and an emitter electrode using the insulating film as a mask for the emitter electrode.

2. A process for manufacturing a semiconductor device as is claimed in claim 1, wherein said conducting film is deposited in a form of non-doped polycrystal or amorphous silicon.

3. A process for manufacturing a semiconductor device as is claimed in claim 1, wherein said conducting film is polycrystal silicon deposited containing a N type impurity in concentration of $1\times10^{17}$ to $1\times10^{21}$ cm$^{-3}$.

4. A process for manufacturing a semiconductor device as is claimed in claim 1, wherein said conducting film is a composite film consisting of a silicide with a high melting metal and polycrystal or amorphous silicon.

5. A process for manufacturing a semiconductor device as is claimed in claim 1, wherein said conducting film is a high-melting metal or a silicide with a high-melting metal.

6. A process for manufacturing a semiconductor device as is claimed in claim 1, wherein surfaces of said gate electrode, a source-drain area and an extrinsic base of a bipolar transistor are silicified.

7. A process for manufacturing a semiconductor device, comprising:

forming a gate oxide film on a semiconductor substrate;

opening an emitter contact on the gate oxide film;

forming a conducting film and an insulating film on the gate oxide film;

selectively removing the insulating film except for an area substantially overlapping with the emitter contact;

forming a mask for a gate electrode and an emitter electrode; and simultaneously removing portions of the conducting film using the mask to form the gate electrode and the emitter electrode, wherein a portion of the mask for the emitter electrode includes the insulating film.

8. A process for manufacturing a semiconductor device as is claimed in claim 7, wherein said conducting film is deposited in a form of non-doped polycrystal or amorphous silicon.

9. A process for manufacturing a semiconductor device as is claimed in claim 7, wherein said conducting film is polycrystal silicon deposited containing a N type impurity in concentration of $1\times10^{17}$ to $1\times10^{21}$ cm$^{-3}$.

10. A process for manufacturing a semiconductor device as is claimed in claim 7, wherein said conducting film is a composite film consisting of a silicide with a high melting metal and polycrystal or amorphous silicon.

11. A process for manufacturing a semiconductor device as is claimed in claim 7, wherein said conducting film is a high-melting metal or a silicide with a high-melting metal.

12. A process for manufacturing a semiconductor device as is claimed in claim 7, wherein surfaces of said gate electrode, a source-drain area, an extrinsic base of a bipolar transistor and a withdrawal part of the emitter electrode are silicified.

13. A method of manufacturing a semiconductor device, comprising:

forming a polysilicon film;

forming an insulating film on said polysilicon film;

etching said insulating film using a first mask to leave a portion of said insulating film on an emitter contact portion of said semiconductor device, wherein said etching removes a portion of said insulating film over a gate electrode portion of said semiconductor device; and implanting impurities into a portion of said polysilicon film not covered by the portion of said insulating film.

14. A method, according to claim 13, further comprising:

forming a second mask on said polysilicon film prior to implanting impurities.

15. A method, according to claim 14, wherein said second mask has at least two separate components.

16. A method, according to claim 15, further comprising:

forming an n-type LDD layer in an area corresponding to a first component of said second mask; and forming a p-type LDD layer in an area corresponding to a second component of said second mask.

17. A method, according to claim 16, further comprising:

forming an n-type source-drain corresponding to said n-type LDD layer; and forming a p-type source-drain corresponding to said p-type LDD layer.

18. A method, according to claim 17, further comprising:

forming a sidewall corresponding to a portion of said polysilicon film.

19. A method of manufacturing a semiconductor device, comprising:

pre-forming an insulating film on an area for forming an emitter of the semiconductor device;

selectively etching at least one layer of the polysilicon to form a gate and an emitter, wherein said insulating film is used as a mask for said emitter only; and forming an extrinsic base by implanting ions while using the insulating film as a mask.

20. A method, according to claim 19, wherein selectively etching includes using at least one photoresist as a mask in addition to said insulating film.

21. A method, according to claim 19, wherein implanting impurities includes implanting N$^+$ type impurities.

22. A method, according to claim 21, wherein implanting N$^+$ type impurities includes providing at least one of: phosphorous and arsenic in concentrations of $1\times10^{17}$ to $1\times10^{21}$.

23. A method, according to claim 22, wherein implanting N$^+$ type impurities includes providing impurities in concentrations of $1\times10^{18}$ to $1\times10^{20}$.

* * * * *